United States Patent [19]

Wada et al.

[11] 4,417,267
[45] Nov. 22, 1983

[54] COOLING MEANS FOR SEMICONDUCTOR DEVICE

[75] Inventors: Hifumi Wada; Mitsuaki Nanba, both of Himeji, Japan

[73] Assignee: Mitsubishi Denki Kabushiki Kaisha, Tokyo, Japan

[21] Appl. No.: 263,275

[22] Filed: May 13, 1981

[30] Foreign Application Priority Data

Jun. 18, 1980 [JP] Japan .............................. 55-86233[U]

[51] Int. Cl.³ ..................... H01L 23/02; H01L 23/48; H01L 29/46; H01L 29/62
[52] U.S. Cl. ....................................... 357/81; 357/65; 357/67; 357/68
[58] Field of Search ....................... 357/65, 67, 68, 81

[56] References Cited

U.S. PATENT DOCUMENTS

| | | | |
|---|---|---|---|
| 2,763,822 | 9/1956 | Frola et al. | 357/67 |
| 3,187,812 | 6/1965 | Staver | 357/81 |
| 3,396,361 | 8/1968 | Sussman | 357/81 |
| 3,434,018 | 3/1969 | Boczar et al. | 357/81 |
| 3,930,115 | 12/1975 | Uden et al. | 357/81 |
| 4,196,444 | 4/1980 | Butner et al. | 357/68 |

Primary Examiner—Andrew J. James
Assistant Examiner—Seth Nehrbass
Attorney, Agent, or Firm—Oblon, Fisher, Spivak, McClelland & Maier

[57] ABSTRACT

A cooling means for a semiconductor device comprises a heat radiating plate made of aluminum or aluminum alloy, having a fitting part for a semiconductor device; an alloy layer formed only at said fitting part of the heat radiating plate to allow easy soldering and a solder layer for bonding said semiconductor device to said alloy layer.

2 Claims, 2 Drawing Figures

COOLING MEANS FOR SEMICONDUCTOR DEVICE

BACKGROUND OF THE INVENTION

1. Field of the Invention:

The present invention relates to an improvement of the surface structure of a heat radiating plate processed prior to soldering of a semiconductor device, said heat radiating plate comprising aluminum or aluminum alloy for cooling the semiconductor device.

2. Description of the Prior Art:

FIG. 1 shows the conventional semiconductor device of this kind. In the figure, the reference numeral (1) designates a heat radiating plate made of aluminum or aluminum alloy having a recess (1a); (2a) designates a plating layer covering the entire surface of the heat radiating plate (1), said plating layer being provided to provide a good soldering; (3) designates a semiconductor device such as a diode device attached in the recess (1a) of the heat radiating plate (1); and (4) designates a solder for bonding the semiconductor device (3) to the plating layer (2a).

The conventional device is prepared as follows: a heat radiating plate (1) is fabricated using aluminum or aluminum alloy; a recess (1a) for receiving a semiconductor device is formed at a predetermined position; plating is applied to the heat radiating plate to coat the entire surface with a plating layer (2a); a semiconductor device (3) is placed at a predetermined position in the recess (1a) of the heat radiating plate (1); and the semiconductor device (3) is bonded on the plating layer (2a) by solidifying a molten solder; thus the fabrication is completed.

In the conventional device, heat produced by the actuation of the semiconductor device (3) is conducted through the solder (4) and the plating layer (2a) to the heat radiating plate (1) so that the heat is radiated from the surface of the plating layer (2a) so as to cool the semiconductor device (3).

The conventional device has a disadvantage in that the plating layer (2a) easily becomes loose because of a local battery effect produced between pin-holes in the plating layer (2a) and a metal substrate different from the material of the layer except for the soldered portion because the entire surface of the heat radiating plate (1) is plated. The partial peeling of the layer produces an air gap between the heat radiating plate (1) and the plating layer (2a) resulting in inferior radiating. When the plating layer (2a) completely peels off, short-circuiting may occur in another circuit resulting in an erroneous operation.

SUMMARY OF THE INVENTION

It is an object of the present invention to overcome the disadvantage of the conventional semiconductor device and to provide a cooling means for the semiconductor device for preventing the reduction of heat-radiating effects by forming by a simple step an alloy layer only at a position of the heat radiating plate where the semiconductor device is attached.

The foregoing and other objects of the present invention have been attained by providing a cooling means for a semiconductor device which comprises a heat radiating plate made of aluminum or aluminum alloy, having a fitting part for a semiconductor device; an alloy layer formed only at said fitting part of the heat radiating plate to allow easy soldering and a solder layer for bonding said semiconductor device to said alloy layer.

DESCRIPTION OF THE PREFERRED EMBODIMENT

An embodiment of the present invention will be described with reference to FIG. 2.

Figure 1:
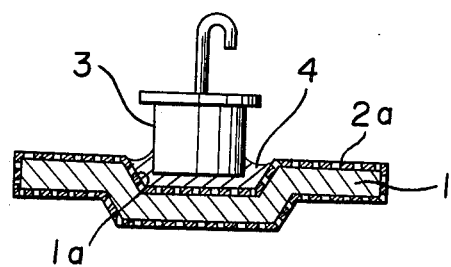
FIG. 1 is a sectional view of the conventional cooling means for a semiconductor device.
Figure 2:
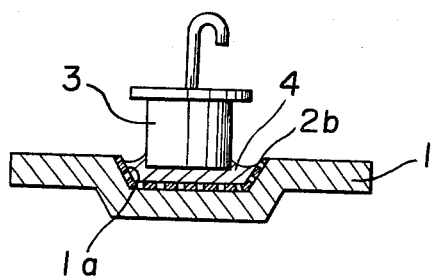
FIG. 2 is a sectional view of an embodiment of the cooling means of a semiconductor device of the present invention.

In FIG. 2, the reference numeral (2a) designates an alloy layer formed in the recess (1a) of a heat radiating plate (1) so as to allow the easy soldering of a semiconductor device (3) to the heat radiating plate (1) and metal halide particles are dispersed on the surface of the recess (1a) and heat is applied to the recess to produce the sublimation of aluminum halide.

The cooling means of the embodiment is fabricated as follows: the heat radiating plate (1) is made using aluminum or aluminum alloy; the recess (1a) as a fitting part for the semiconductor device (3) is formed at a predetermined position in the heat radiating plate; metal halide particles are dispersed on the surface of the recess (1a); and heat is applied to the heat radiating plate (1) to produce the sublimation of aluminum halide whereby the alloy layer (2b) is formed only on the surface of the recess (1a); the semiconductor device (3) is placed in the recess (1a) of the heat radiating plate (1) as in the conventional device; and the semiconductor device is bonded to the alloy layer by soldering.

In the cooling means of the present invention, the semiconductor device (3) is soldered to the alloy layer (2b) covering the recess (1a). Accordingly, even though there are pin-holes in the alloy layer (2b), the pin-holes are covered by the solder whereby no separation of the alloy layer (2b) occurs.

In this embodiment, the alloy layer is formed only in the recess (1a) of the heat radiating plate (1) by sublimation of aluminum halide whereby the alloy layer can be easily formed in a local area and the peeling-off of the alloy layer can be completely prevented. Accordingly, the heat radiation of the plate is excellent and any fault such as short-circuiting of another circuit caused by peeling-off of the alloy layer (2a) can be eliminated.

In the embodiment described above, the alloy layer (2b) is formed by dispersing metal halide particles only on the surface of the recess (1a) and applying heat to the metal halide in the recess thereby causing sublimation of aluminum halide. It is possible to form the alloy layer by injection coating a metal, having affinity for soldering, only on the surface of the recess (1a).

As described above, in accordance with the present invention, an alloy layer is formed on only the fitting part of the heat radiating plate to fit a semiconductor device. Therefore, the surface of the heat radiating plate other than the fitting part for the semiconductor device is exposed. Thus, the peeling-off of the plating layer and reduction of heat-radiation effect, which are disadvantages in the conventional device, can be eliminated and the semiconductor device can be prepared by a simply step and the reliability can be increased.

We claim:

1. A cooling means for a semiconductor device which comprises a heat radiating plate made of aluminum or aluminum alloy, having a fitted part for a semiconductor device; an alloy layer formed only at said fitting part of the heat radiating plate to allow easy soldering and a solder layer for bonding said semiconductor device to said alloy layer, wherein said alloy layer is formed by heating a metal halide dispersed on the fitting part.

2. A cooling means for a conductor device according to claim 1 wherein said alloy layer for allowing easy soldering is formed on the surface of a recess.

* * * * *